United States Patent
Wang et al.

(10) Patent No.: US 10,928,869 B2
(45) Date of Patent: Feb. 23, 2021

(54) HEAT DISSIPATION MODULE

(71) Applicant: Acer Incorporated, New Taipei (TW)

(72) Inventors: Chun-Chieh Wang, New Taipei (TW);
Wen-Neng Liao, New Taipei (TW);
Cheng-Wen Hsieh, New Taipei (TW);
Wei-Chin Chen, New Taipei (TW);
Jau-Han Ke, New Taipei (TW)

(73) Assignee: Acer Incorporated, New Taipei (TW)

( * ) Notice: Subject to any disclaimer, the term of this patent is extended or adjusted under 35 U.S.C. 154(b) by 79 days.

(21) Appl. No.: 16/355,847

(22) Filed: Mar. 18, 2019

(65) Prior Publication Data

US 2020/0183469 A1 Jun. 11, 2020

(30) Foreign Application Priority Data

Dec. 5, 2018 (TW) .............................. 107143651 A

(51) Int. Cl.
*G06F 1/20* (2006.01)
*H05K 7/20* (2006.01)

(52) U.S. Cl.
CPC ......... *G06F 1/203* (2013.01); *H05K 7/20318* (2013.01); *H05K 7/20327* (2013.01); *H05K 7/20336* (2013.01)

(58) Field of Classification Search
CPC .. F28D 15/0266; G06F 1/203; H05K 7/20336
USPC .................................................. 165/104.26
See application file for complete search history.

(56) References Cited

U.S. PATENT DOCUMENTS

| | | | | |
|---|---|---|---|---|
| 5,953,930 A | * | 9/1999 | Chu | F25B 23/006 165/104.21 |
| 6,223,810 B1 | * | 5/2001 | Chu | F28D 15/0266 165/104.26 |
| 2005/0217829 A1 | * | 10/2005 | Belits | F28F 3/02 165/104.33 |
| 2006/0225867 A1 | * | 10/2006 | Park | F28F 9/0263 165/80.4 |
| 2011/0277967 A1 | * | 11/2011 | Fried | F28D 15/04 165/104.26 |

(Continued)

FOREIGN PATENT DOCUMENTS

| | | |
|---|---|---|
| CN | 201115234 | 9/2008 |
| CN | 101325863 | 12/2008 |

(Continued)

OTHER PUBLICATIONS

"Search Report of Europe Counterpart Application", dated Feb. 19, 2020, p. 1-p. 5.

*Primary Examiner* — Henry T Crenshaw
(74) *Attorney, Agent, or Firm* — JCIPRNET

(57) ABSTRACT

A heat dissipation module including a chamber, a first cooling member, and a barrier part is provided. The chamber has an accommodating space, at least one inlet, and at least one outlet. The at least one inlet is disposed in a first side wall of the chamber and communicates with the accommodating space. The at least one outlet is disposed in a second side wall of the chamber away from the at least one inlet and communicates with the accommodating space. The first cooling member is disposed in the accommodating space. The first cooling member has a guiding surface which extends obliquely upward. The barrier part is disposed outside the guiding surface of the first cooling member and has at least one through hole.

9 Claims, 3 Drawing Sheets

(56) References Cited

U.S. PATENT DOCUMENTS

| | | | |
|---|---|---|---|
| 2013/0233521 A1 | 9/2013 | Uchida et al. | |
| 2014/0102670 A1* | 4/2014 | Tu | F28D 15/02 165/104.26 |
| 2016/0216048 A1 | 7/2016 | Tsai et al. | |
| 2016/0227672 A1* | 8/2016 | Lin | H01L 23/427 |
| 2016/0258691 A1* | 9/2016 | Wang | F28F 3/12 |

FOREIGN PATENT DOCUMENTS

| | | |
|---|---|---|
| CN | 202142520 | 2/2012 |
| CN | 202267910 | 6/2012 |
| CN | 101762194 | 9/2012 |
| CN | 105700653 | 6/2016 |
| CN | 207118203 | 3/2018 |
| TW | M455331 | 6/2013 |
| TW | M457222 | 7/2013 |
| TW | M472875 | 2/2014 |
| TW | I585354 | 6/2017 |

\* cited by examiner

HEAT DISSIPATION MODULE

CROSS-REFERENCE TO RELATED APPLICATION

This application claims the priority benefit of Taiwan application serial no. 107143651, filed on Dec. 5, 2018. The entirety of the above-mentioned patent application is hereby incorporated by reference herein and made a part of this specification.

BACKGROUND

Technical Field

The disclosure relates to a heat dissipation module, and more particularly to a heat dissipation module suitable for horizontal placement.

Description of Related Art

In the existing technology, a heat dissipation chamber of gas-liquid phase heat transfer has been applied to a low-power, fan-less tablet computer. The existing heat dissipation chamber uses the characteristic that the tablet is obliquely placed on a tabletop to achieve the effect of gas-liquid circulation heat dissipation through convection and condensation of water vapor. If the existing heat dissipation chamber is applied to a high-power notebook computer, the heat dissipation efficiency of the heat dissipation module according to the existing technology is insufficient to cope with the heat dissipation need of high-power electronic devices without the help of external heat dissipation components (such as a fan).

Therefore, a cardiac cycle heat dissipation module has been developed, and its structure mainly includes two parts: a valve pump tank and a conducting pipe communicating with the valve pump tank. The valve pump tank is provided with a heat dissipation liquid and is for contacting a heat source, so that the liquid in the valve pump tank is heated and evaporates into a gas by heat transfer through wall surfaces of the valve pump tank. When the liquid is converted into a gas, a high pressure is produced due to volume expansion, so that the high-pressure vapor flows into the low-pressure conducting pipe in accordance with the direction of the flow path. After that, the high-temperature vapor dissipates heat in the conducting pipe and re-condenses into a low-temperature liquid, and then it returns to the valve pump tank along the flow path under the effect of gravity to complete the circulation of gas-liquid heat dissipation.

Because the vapor flow in the cardiac cycle heat dissipation module needs to match the flow path in a vertical direction, the cardiac cycle heat dissipation module has to be placed in a flat state when applied to a notebook computer. In this way, the direction of the vapor flow and the direction of the flow path are perpendicular to each other. However, this causes some of the high-temperature vapor to accumulate at the inlet and outlet of the valve pump tank instead of all moving toward the direction of the conducting pipe. The accumulation of the high-temperature vapor prevents the condensed liquid from entering the valve pump tank, which causes the total amount of liquid in the valve pump tank to be insufficient and unable to continuously absorb the heat of the heat source. This causes the operation temperature of the notebook computer to be excessively high.

SUMMARY

The disclosure provides a heat dissipation module which can improve the defect that high-temperature vapor accumulates at an inlet after heat absorption in horizontal placement, thereby affecting the heat dissipation efficiency.

The heat dissipation module of the disclosure includes a chamber, a first cooling member, and a barrier part. The chamber has an accommodating space, at least one inlet, and at least one outlet. The at least one inlet is disposed in a first side wall of the chamber and communicates with the accommodating space. The at least one outlet is disposed in a second side wall of the chamber away from the at least one inlet and communicates with the accommodating space. The first cooling member is disposed in the accommodating space. The first cooling member has a guiding surface which extends obliquely upward. The barrier part is disposed outside the guiding surface of the first cooling member and has at least one through hole. The chamber is adapted to contact a heat source. A low-temperature liquid enters the accommodating space through the at least one inlet and contacts the first cooling member, and the low-temperature liquid forms a high-temperature gas after heat absorption and is guided toward the at least one outlet by the guiding surface to flow out of the accommodating space.

Based on the above, the heat dissipation module of the disclosure employs the first cooling member and the barrier part. The first cooling member is for heating the low-temperature liquid and has the guiding surface for guiding the high-temperature gas. The first cooling member can increase the contact area with the low-temperature liquid and increase the heat absorption and evaporation rate of the low-temperature liquid. The guiding surface of the first cooling member can guide the high-temperature gas after the heat absorption toward the at least one outlet of the chamber to prevent it from accumulating at the at least one through hole and blocking the inflow of the low-temperature liquid.

In addition, the barrier part is disposed outside the first cooling member. The barrier part is used for allowing the low-temperature liquid to pass through and preventing the high-temperature gas from flowing back. Further, the barrier part is used for isolating the high temperature of the first cooling member to prevent the low-temperature liquid from vaporizing at the inlet of the chamber to ensure that the low-temperature liquid can flow into the first cooling member to achieve an optimal heat dissipation effect.

In order to make the aforementioned features and advantages of the disclosure comprehensible, embodiments accompanied with drawings are described in detail below.

DESCRIPTION OF THE EMBODIMENTS

Figure 1A:
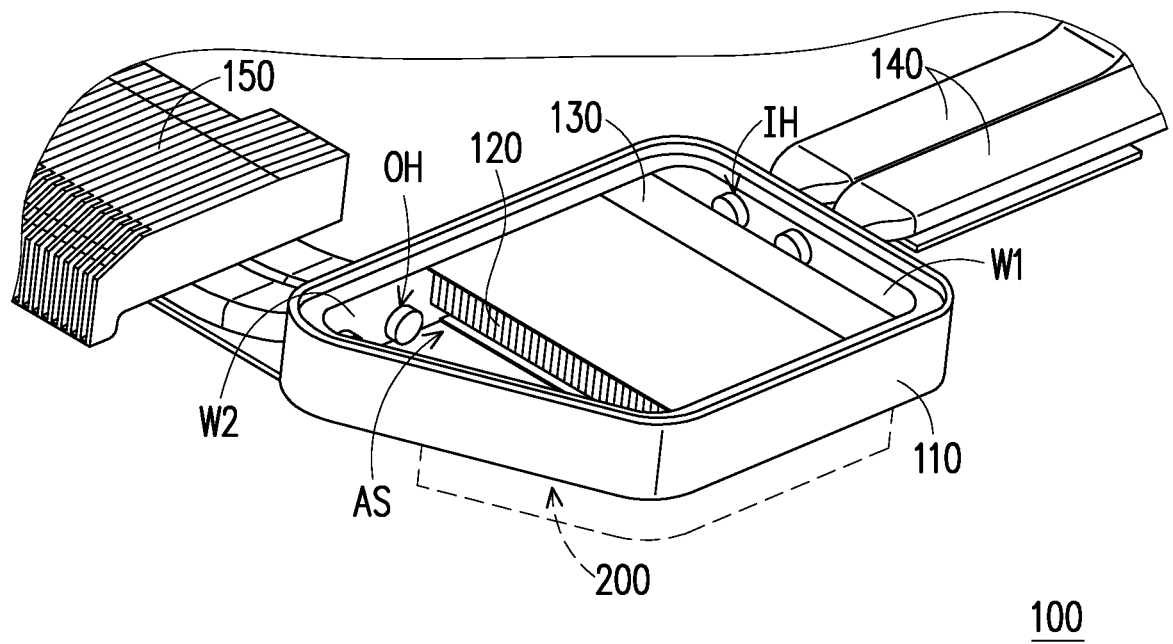
FIG. 1A is a schematic perspective view of part of the components of a heat dissipation module according to an embodiment of the disclosure.
Figure 1B:
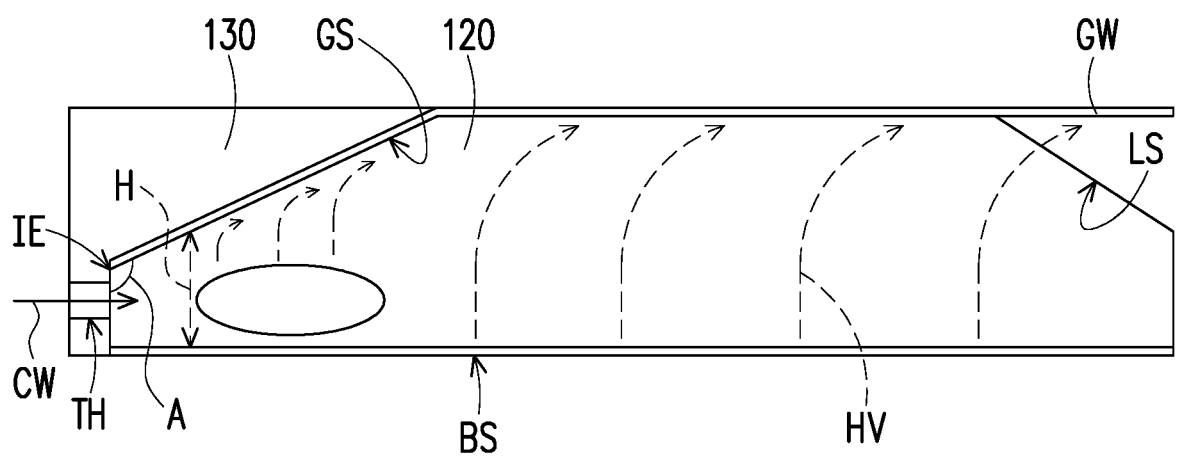
FIG. 1B is a schematic plan view of a first cooling member and a barrier part of the heat dissipation module of FIG. 1A.
Figure 1C:
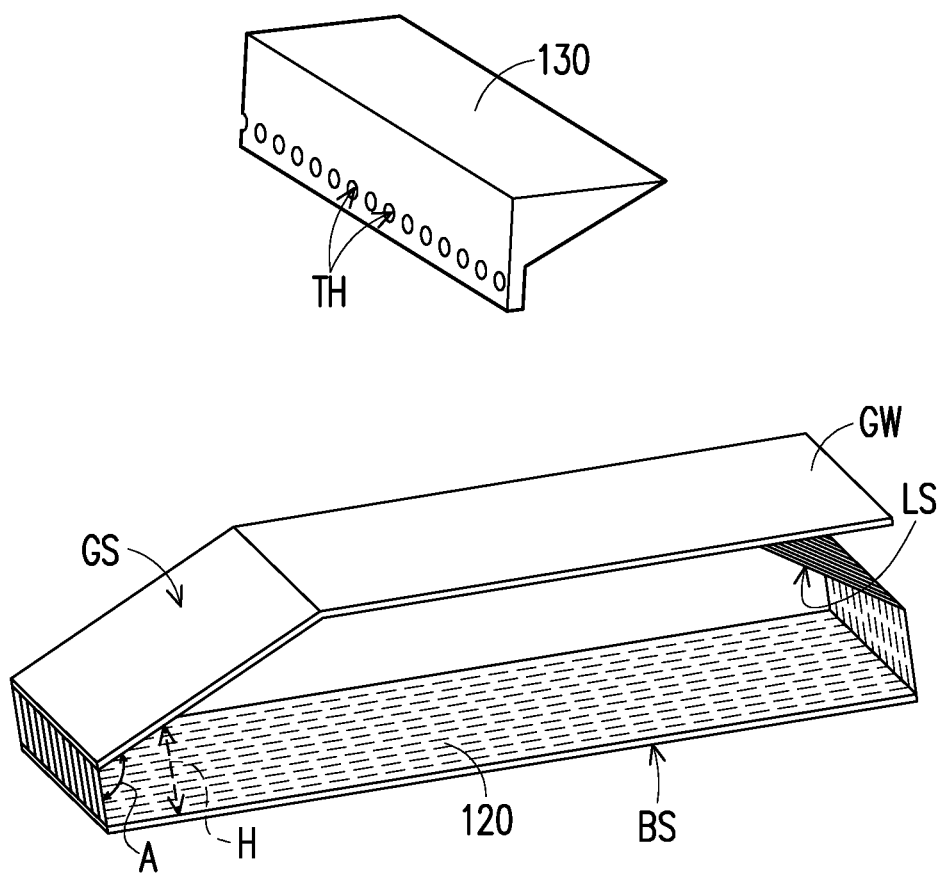
FIG. 1C is a schematic component exploded view of the first cooling member and the barrier part of FIG. 1B.
Figure 1D:
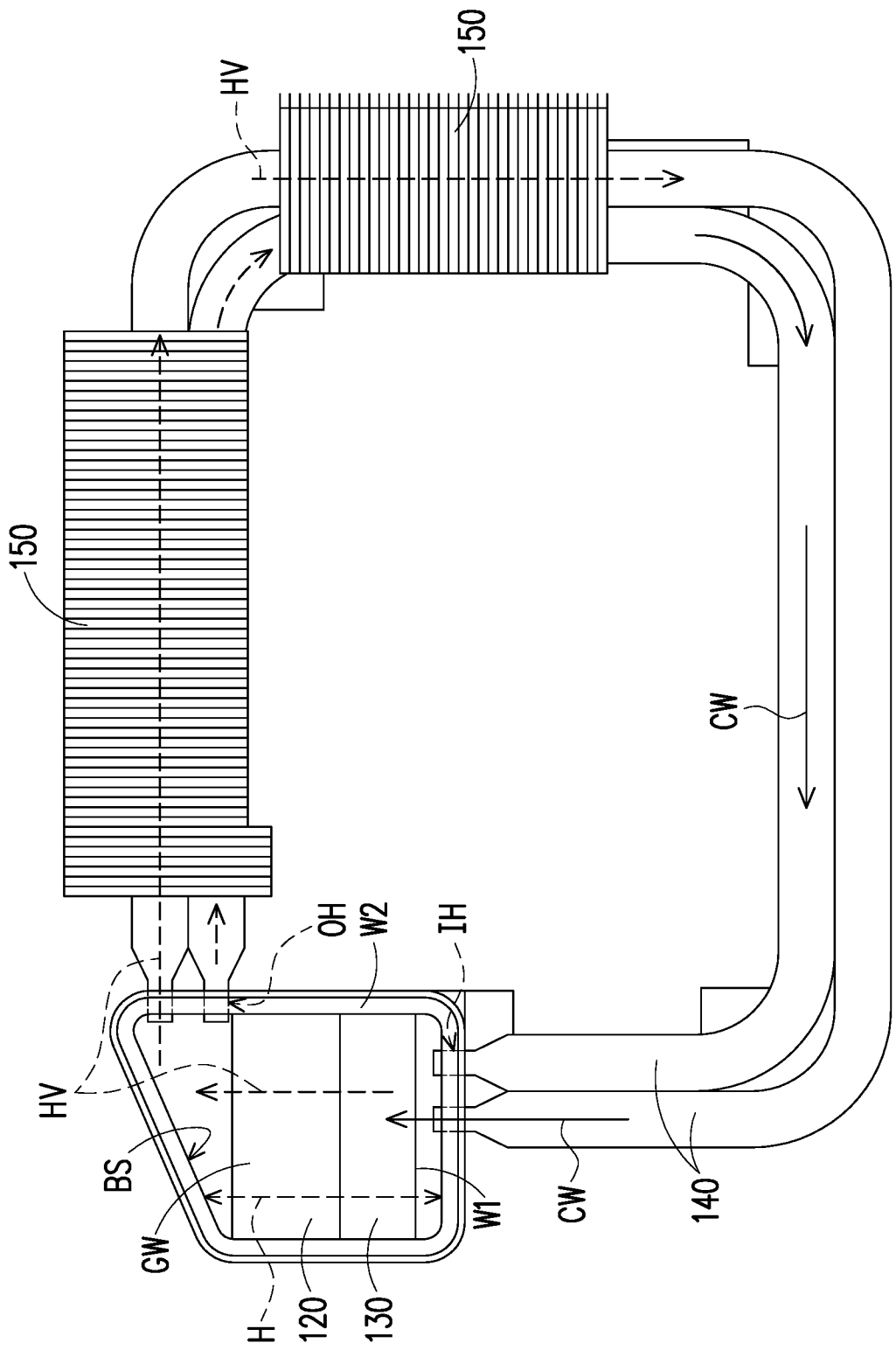
FIG. 1D is a schematic plan view of the heat dissipation circulation of the heat dissipation module of FIG. 1A.

FIG. 1A is a schematic perspective view of part of the components of a heat dissipation module according to an embodiment of the disclosure. FIG. 1B is a schematic plan view of a first cooling member and a barrier part of the heat dissipation module of FIG. 1A. FIG. 1C is a schematic component exploded view of the first cooling member and the barrier part of FIG. 1B. FIG. 1D is a schematic plan view of the heat dissipation circulation of the heat dissipation module of FIG. 1A.

In the present embodiment, a heat dissipation module 100 is installed, for example, in a housing of a notebook computer, and the housing of the notebook computer is disposed in parallel on a tabletop. Likewise, the heat dissipation module 100 is also in a placement state being parallel to the tabletop.

With reference to FIGS. 1A to 1D, the heat dissipation module 100 of the disclosure includes a chamber 110, a first cooling member 120, and a barrier part 130.

The chamber 110 has an accommodating space AS, at least one inlet IH, and at least one outlet OH. The at least one inlet IH is disposed in a first side wall W1 of the chamber 110 and communicates with the accommodating space AS. The at least one outlet OH is disposed in a second side wall W2 of the chamber 110 away from the at least one inlet IH and communicates with the accommodating space AS. The number of both the at least one inlet IH and the at least one outlet OH is exemplified with two inlets/outlets in the present embodiment, which is based on the size and heat dissipation need of the heat dissipation module 100, and the disclosure does not limit the number of the outlets and inlets.

The first cooling member 120 is disposed in the accommodating space AS of the chamber 110 and are spaced apart from the inlets IH and the outlets OH, respectively. The first cooling member 120 has a guiding surface GS which extends obliquely upward; that is, the guiding surface GS forms an inclined surface relatively away from the bottom of the chamber 110.

In addition, in the present embodiment, the first cooling member 120 has a gap from the first side wall W1 of the chamber 110 and a gap from a third side wall with respect to the first side wall W1 and the first cooling member 120 abuts against the second side wall W2 and a fourth side wall with respect to the second side wall W2 to limit a low-temperature liquid CW to being only able to flow into the first cooling member 120 so as to achieve an optimal heat dissipation effect. Further, the first side wall W1 and the second side wall W2 are disposed to be perpendicular to each other.

The barrier part 130 is disposed outside the guiding surface GS of the first cooling member 120 and has at least one through hole TH. In the present embodiment, the barrier part 130 is a heat insulating material, which can prevent the low-temperature liquid CW from immediately contacting high temperature upon entering the chamber 110 and then vaporizing and evaporating. In addition, the at least one through hole TH is shown as a plurality of through holes in the drawings, and each of the through holes TH is used for introducing the low-temperature liquid CW into the first cooling member 120 to perform a heat absorption process.

In addition, the bottom of the chamber 110 is adapted to contact a heat source (such as a central processing unit, a graphics processing unit, etc., which generate high heat during operation), and the low-temperature liquid CW enters the accommodating space AS through the at least one inlet IH and passes through the barrier part 130 to contact the first cooling member 120. The low-temperature liquid CW forms a high-temperature gas HV after the heat absorption and is guided toward the at least one outlet OH of the chamber 110 by the barrier part 130 and the guiding surface GS to flow out of the accommodating space AS.

Further, a vertical height H of the guiding surface GS with respect to a bottom surface BS of the first cooling member 120 is gradually increased in a direction away from the at least one through hole TH of the barrier part 130. The guiding surface GS has an angle A with respect to an inflow end IE of the first cooling member 120. In the present embodiment, the angle A between the guiding surface GS and the inflow end IE is, for example, greater than 90 degrees and less than 180 degrees, which ensures that the guiding direction of the guiding surface GS is consistent with the flow direction of the low-temperature liquid CW.

The first cooling member 120 has a limiting surface LS and a baffle GW. The limiting surface LS extends obliquely downward in a direction away from the barrier part 130. The baffle GW is disposed at the top of the first cooling member 120, and the baffle GW is partially protruded and suspended in the accommodating space AS. In short, the limiting surface LS and the baffle GW are used for limiting the high-temperature gas HV after the heat absorption to flowing to the at least one outlet OH.

Further, the chamber 110 has a barrier surface BS connected to the second side wall W2. A horizontal width W of the barrier surface BS with respect to the first side wall W1 is gradually increased toward a direction of the at least one outlet OH. This also facilitates guiding the high-temperature gas HV to flow toward the at least one outlet OH.

The heat dissipation module 100 further includes at least one circulation line 140 (exemplified with two circulation lines 140 in the drawings) and a plurality of second cooling fins 150. Each of the circulation lines 140 communicates with the accommodating space AS by the at least one inlet IH and the at least one outlet OH, respectively. The plurality of second cooling fins 150 are respectively disposed at a periphery of each of the circulation lines 140 and are relatively away from the at least one inlet IH of the chamber 110.

A gas-liquid circulation heat dissipation process of the heat dissipation module 100 will be described in detail below with reference to FIGS. 1A to 1D. When the heat dissipation circulation starts (i.e., a heat source 200 starts operating and generating high heat), the low-temperature liquid CW placed in the chamber 110 is heated by the first cooling member 120 and evaporates to form the high-temperature gas HV. After the high-temperature gas HV is formed, it is guided by the guiding surface GS and the barrier part 130 to move toward the at least one outlet OH of the chamber 110 to form a gas flow in a single direction, so that the high-temperature gas HV does not accumulate in the first cooling member 120. Then, the high-temperature gas HV flows into the circulation lines 140 through high-pressure driving and dissipates the heat carried by the high-temperature gas HV in the air through the heat transfer effect of pipe walls of the circulation lines 140 and the plurality of second cooling fins 150 during the flowing. The high-temperature gas HV condenses to form the low-temperature liquid CW after the heat dissipation, in the end flows back to the chamber 110 through the circulation lines 140 and returns to the first cooling member 120 through the plurality of through holes TH of the barrier part 130 to complete the gas-liquid circulation heat dissipation.

In summary of the above, the heat dissipation module of the disclosure employs the first cooling member and the barrier part. The first cooling member is for heating the low-temperature liquid and has the guiding surface for guiding the high-temperature gas. The first cooling member can increase the contact area with the low-temperature liquid and increase the heat absorption and evaporation rate of the low-temperature liquid. The guiding surface of the first cooling member can guide the high-temperature gas after the heat absorption toward the at least one outlet of the chamber to prevent it from accumulating at the at least one through hole and blocking the inflow of the low-temperature liquid.

In addition, the barrier part is disposed outside the first cooling member. The barrier part is used for allowing the low-temperature liquid to pass through and preventing the high-temperature gas from flowing back. Further, the barrier part is used for isolating the high temperature of the first cooling member to prevent the low-temperature liquid from vaporizing at the inlet of the chamber to ensure that the low-temperature liquid can flow into the first cooling member to achieve an optimal heat dissipation effect.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A heat dissipation module, comprising:
    a chamber having:
        an accommodating space;
        at least one inlet disposed in a first side wall of the chamber and communicating with the accommodating space; and
        at least one outlet disposed in a second side wall of the chamber away from the at least one inlet and communicating with the accommodating space;
    a first cooling member disposed in the accommodating space and having a guiding surface extending obliquely; and
    a barrier part disposed outside the guiding surface of the first cooling member and having at least one through hole,
    wherein the chamber is adapted to contact a heat source, a low-temperature liquid enters the accommodating space through the at least one inlet and passes through the barrier part to contact the first cooling member, and the low-temperature liquid forms a high-temperature gas after heat absorption and is guided toward the at least one outlet by the barrier part and the guiding surface to flow out of the accommodating space,
    wherein the chamber has a barrier surface connected to the second side wall, and a horizontal width of the barrier surface with respect to the first side wall is gradually increased toward a direction of the at least one outlet.

2. The heat dissipation module according to claim 1, wherein a vertical height of the guiding surface with respect to a bottom surface of the first cooling member is increased in a direction away from the at least one through hole.

3. The heat dissipation module according to claim 2, wherein the guiding surface has an angle with respect to an inflow end of the first cooling member, and the angle is greater than 90 degrees and less than 180 degrees.

4. The heat dissipation module according to claim 1, wherein the barrier part is a heat insulating material.

5. The heat dissipation module according to claim 1, wherein the first cooling member has a limiting surface which extends obliquely in a direction away from the barrier part.

6. The heat dissipation module according to claim 1, wherein the first cooling member has a baffle which is disposed at a top of the first cooling member and is partially protruded and suspended in the accommodating space.

7. The heat dissipation module according to claim 1, wherein the first side wall and the second side wall are disposed to be perpendicular to each other.

8. The heat dissipation module according to claim 1, further comprising at least one circulation line which communicates with the accommodating space by the at least one inlet and the at least one outlet, respectively.

9. The heat dissipation module according to claim 8, further comprising a plurality of second cooling fins which are disposed at a periphery of the at least one circulation line and are relatively away from the at least one inlet.

* * * * *